(12) United States Patent
Wang et al.

(10) Patent No.: US 10,426,026 B2
(45) Date of Patent: Sep. 24, 2019

(54) STRUCTURE CONSTRUCTED BY SHEET

(71) Applicant: Industrial Technology Research Institute, Hsinchu (TW)

(72) Inventors: Chao-Jen Wang, Hsinchu (TW); Chih-Chia Chang, Hsinchu County (TW); Chiung-Hsun Hsieh, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 333 days.

(21) Appl. No.: 15/229,095

(22) Filed: Aug. 4, 2016

(65) Prior Publication Data
US 2017/0332477 A1 Nov. 16, 2017

(30) Foreign Application Priority Data

May 11, 2016 (TW) .............................. 105114513 A (51) Int. Cl.
*B32B 3/24* (2006.01)
*H05K 1/02* (2006.01)
(Continued)

(52) U.S. Cl.
CPC ........... *H05K 1/028* (2013.01); *H05K 1/0286* (2013.01); *H05K 1/0292* (2013.01);
(Continued)

(58) Field of Classification Search
CPC ..................... Y10T 428/24314; H05K 1/028
(Continued)

(56) References Cited

U.S. PATENT DOCUMENTS 5,789,050 A * 8/1998 Kang .................. B26F 1/18
283/71
7,629,691 B2 12/2009 Roush et al.
(Continued)

FOREIGN PATENT DOCUMENTS

| CN | 101320309 | 12/2008 |
|---|---|---|
| CN | 101989019 | 3/2011 |

(Continued)

OTHER PUBLICATIONS

"Office Action of Taiwan Counterpart Application," dated Dec. 26, 2017, p. 1-p. 4, in which the listed reference was cited.
(Continued)

*Primary Examiner* — William P Watkins, III
(74) *Attorney, Agent, or Firm* — JCIPRNET (57) ABSTRACT

According to an embodiment of the present disclosure, a structure constructed by a sheet includes a sheet body. The sheet body has a plurality of enclosed paths. A plurality of slits and connection portions are arranged along each enclosed path. Each connection portion is located between two adjacent slits. The sheet body is flexible. In an extended state, the slits form extended openings. At least one extended opening is a symmetric opening, so that the sheet body is extended to form a structure constructed by sheet. The structure constructed by sheet forms a stereoscopic curved surface, and the plurality of connection portions is located on a plurality of contours of the stereoscopic curved surface.

20 Claims, 9 Drawing Sheets

(51) Int. Cl.
*H05K 1/03* (2006.01)
*H05K 3/00* (2006.01)
*H05K 3/28* (2006.01)
*B32B 3/26* (2006.01)

(52) U.S. Cl.
CPC ......... *H05K 1/0313* (2013.01); *H05K 1/0393* (2013.01); *H05K 3/0058* (2013.01); *H05K 3/28* (2013.01); *B32B 3/266* (2013.01); *H05K 1/032* (2013.01); *H05K 1/0333* (2013.01); *H05K 2201/0158* (2013.01); *H05K 2201/0162* (2013.01); *H05K 2201/056* (2013.01); *H05K 2201/09036* (2013.01); *H05K 2201/09063* (2013.01); *Y10T 428/24314* (2015.01)

(58) Field of Classification Search
USPC ........................................................ 428/136
See application file for complete search history.

(56) References Cited

U.S. PATENT DOCUMENTS

| | | | |
|---|---|---|---|
| 8,097,926 B2 | 1/2012 | De Graff et al. | |
| 8,492,876 B2 | 7/2013 | Wong et al. | |
| 8,633,916 B2 | 1/2014 | Bernstein et al. | |
| 8,883,287 B2 | 11/2014 | Boyce et al. | |
| 9,860,976 B1* | 1/2018 | Wang | H05K 1/0283 |
| 2003/0104167 A1* | 6/2003 | Spektor | B27M 3/0093 |
| | | | 428/136 |
| 2005/0280157 A1 | 12/2005 | Roush et al. | |
| 2008/0157235 A1 | 7/2008 | Rogers et al. | |
| 2009/0184954 A1 | 7/2009 | Street | |
| 2010/0096729 A1 | 4/2010 | Wong et al. | |
| 2010/0238636 A1 | 9/2010 | Mascaro et al. | |
| 2010/0298895 A1 | 11/2010 | Ghaffari et al. | |
| 2010/0301879 A1 | 12/2010 | Philipp | |
| 2011/0018556 A1 | 1/2011 | Le et al. | |
| 2011/0031041 A1 | 2/2011 | Bulea et al. | |
| 2011/0069459 A1* | 3/2011 | Padiy | A61B 5/01 |
| | | | 361/748 |
| 2011/0139517 A1 | 6/2011 | Mizushima | |
| 2011/0248954 A1 | 10/2011 | Hamada et al. | |
| 2013/0041235 A1 | 2/2013 | Rogers et al. | |
| 2013/0234977 A1 | 9/2013 | Lin et al. | |
| 2013/0281814 A1 | 10/2013 | Tilt et al. | |
| 2013/0319135 A1 | 12/2013 | Okada et al. | |
| 2014/0296687 A1 | 10/2014 | Irazoqui et al. | |
| 2015/0034935 A1 | 2/2015 | Choi | |

FOREIGN PATENT DOCUMENTS

| | | |
|---|---|---|
| CN | 102036600 | 4/2011 |
| CN | 102918370 | 2/2013 |
| CN | 104952832 | 9/2015 |
| EP | 0841649 | 5/1998 |
| TW | 200933558 | 8/2009 |
| TW | M505308 | 7/2015 |
| WO | 2014058473 | 4/2014 |

OTHER PUBLICATIONS

Cho et al., "Engineering the shape and structure of materials by fractal cut," Proceedings of the National Academy of Sciences, Dec. 9, 2014, pp. 17390-17395.

"Office Action of Taiwan Related Application No. 105144039," dated Apr. 21, 2017, p. 1-p. 5, in which the listed references were cited.

"Office Action of Taiwan Related Application, Application No. 105139083", dated Apr. 10, 2018, p. 1-p. 10, in which the listed references were cited.

"Office Action of China Counterpart Application," dated Mar. 13, 2019, p. 1-p. 5.

* cited by examiner

FIG. 9B sheet body 100 is extended.

STRUCTURE CONSTRUCTED BY SHEET

CROSS-REFERENCE TO RELATED APPLICATION

This application claims the priority benefit of Taiwan application serial no. 105114513, filed on May 11, 2016. The entirety of the above-mentioned patent application is hereby incorporated by reference herein and made a part of this specification.

TECHNICAL FIELD

The disclosure relates to a structure, and particularly relates to a sheet-like structure.

BACKGROUND

Following the advanced development of electronic technologies, electronic products are evolving rapidly. To apply the electronic products in different fields, the characteristics of being flexible, light, thin and having no limitation on shape are drawing more and more attention. Namely, there is a requirement on the shape of the electronic products to be various based on different purposes and environments of application. Taking electronic products with a stereoscopic shape as an example, it is difficult to manufacture wirings on a curved surface. The stereoscopic shape may be an irregularly round or spherical shape, and the curvature of the surface of the stereoscopic shape changes in accordance with the design requirement, which makes it difficult to manufacture the electronic products.

SUMMARY

An embodiment of the present disclosure provides a structure constructed by a sheet includes a sheet body. The sheet body has a plurality of enclosed paths. A plurality of slits and a plurality of connection portions are disposed along each of the enclosed paths, and each of the connection portions is located between two adjacent slits. The sheet body is flexible. In an extended state, the slits form a plurality of extended openings. At least one of the extended opening is a symmetric opening, such that the sheet body is extended to form the structure. The structure constructs a stereoscopic curved surface, and the connection portions are arranged along a plurality of contour lines on the stereoscopic curved surface.

In order to the make the present disclosure comprehensible, embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
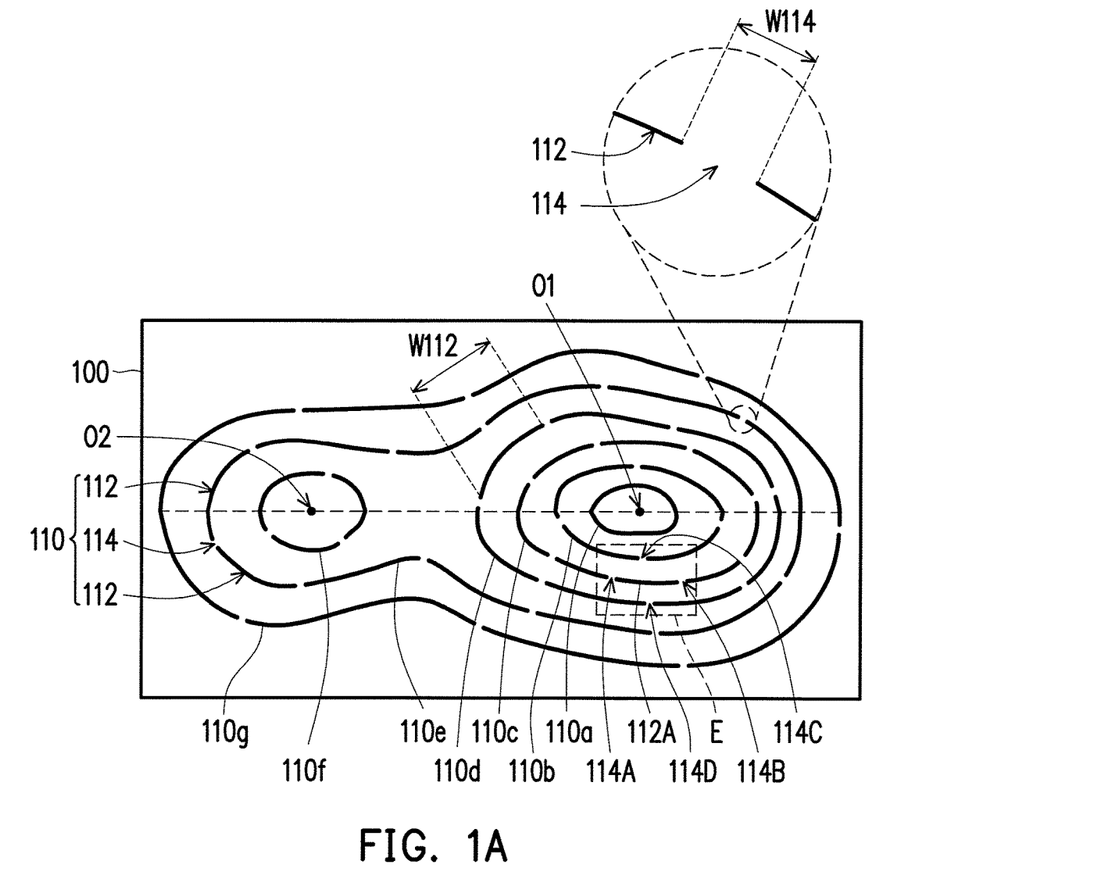
FIG. 1A is a schematic view illustrating a sheet body for constructing a structure according to an embodiment of the disclosure in a non-extended state.

FIG. 1A is a schematic view illustrating a sheet body of a structure constructed by a sheet according to an embodiment of the disclosure in a non-extended state. Referring to FIG. 1A, a sheet body 100 has a plurality of enclosed paths 110. In addition, a plurality of slits 112 and a plurality of connection portions 114 may be disposed along each of the enclosed paths 110. Each connection portion 114 is located between two adjacent slits 112. In this embodiment, the number of the enclosed paths 110 is seven, for example, and the seven enclosed paths 110 are respectively numbered as enclosed paths 110a to 110g. Moreover, the enclosed paths 110a to 110d are sequentially arranged from inner to outer and surround the same center O1, and the enclosed path 110f surrounds another center O2. The enclosed paths 110e and 110g may surround an area defined by the enclosed path 110a to 110d and an area defined by the enclosed path 110f. In addition, the enclosed paths 110a to 110g do not overlap or intersect each other.

A shape of each of the enclosed paths 110a to 110g is not limited to a circle. Taking FIG. 1A as an example, the enclosed paths 110a to 110d and the enclosed path 110f may substantially exhibit a shape of ellipse, whereas the enclosed paths 110e and 110g may exhibit a shape similar to a dumb bell. In other words, one or more of the enclosed paths 110a to 110g may be circular, and a profile of each of the enclosed paths 110a to 110g may be determined based on an environment where the sheet body 100 is applied. In addition, the numbers of the slits 112 and the connection portions 114 disposed on each of the enclosed paths 110a to 110g may be determined by the environment where the sheet body 100 is applied. A density of the enclosed paths 110 may be determined based on practical needs.

Taking the embodiment as an example, the enclosed paths 110a to 110d may be sequentially arranged from inner to outer and surround the same center O1, and the enclosed paths 110a to 110d may have the same numbers of the slits 112 and the connection portions 114, such as four connection portions 114 and four slits 112. The enclosed path 110f surrounding the center O2 may have three connection portions 114 and three slits 112, for example. The slits 112 and/or the connection portions 114 on the enclosed paths 110e and 110g surrounding the center O1 and the center O2 may be disposed in correspondence with the slits 112 and/or the connection portions 114 on the enclosed path 110f and the enclosed path 110d.

In addition, a width W114 of the connection portion 114 measured along the corresponding enclosed path 110 may be adjusted based on a distance between the enclosed paths 110 where the connection portion 114 is located and the adjacent enclosed path 110. In the meantime, a width W112 of the slit 112 measured along the corresponding enclosed path 110 may be adjusted based on a distance between the enclosed paths 110 where the slit 112 is located and the adjacent enclosed path 110. For example, when the distance between the enclosed paths 110 where one of the connection portions 114 and one of the slits 112 are located and the adjacent enclosed path is greater, the width W114 and the width W112 may be set to be greater. The connection portions 114 on the same enclosed path 110 may have different widths W114, and the slits 112 on the same enclosed path 110 may also have different widths W112.

Figure 1B:
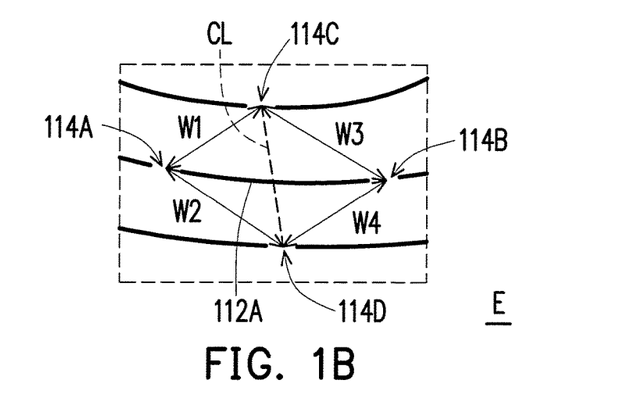
FIG. 1B is a schematic view of a partial region E in FIG. 1A.

As shown in a partial region E of FIG. 1B, surrounding a slit 112A on the enclosed path 110c, a first connection portion 114A and a second connection portion 114B of the same enclosed path 110c may respectively be at two ends of the slit 112A, a third connection portion 114c is on the previous enclosed path 110b is, and a fourth connection portion 114D is on the next enclosed path 110d. A connection line CL between the third connection portion 114C and the fourth connection portion 114D may intersect and pass through the slit 112A. A first distance W1 is provided between the first connection portion 114A and the third connection portion 114C, a second distance W2 is provided between the first connection portion 114A and the fourth connection portion 114D, a third distance W3 is provided between the second connection portion 114B and the third connection portion 114C, and a fourth distance W4 is provided between the second connection portion 114B and the fourth connection portion 114D. According to the embodiment, in an initial state of the sheet body 100, namely the state shown in FIGS. 1A and 1B, the first distance W1, the second distance W2, the third distance W3, and the fourth distance W4 may be the same or different. For example, the first distance W1 and the third distance W3 may be different, or the second distance W2 and the fourth distance W4 may be different. In other embodiments, the first distance W1, the second distance W2, the third distance W3, and the fourth distance W4 may be respectively different values. Accordingly, the slit 112 may be surrounded by four connection portions 114, and two of the four connection portions 114 may be located at two ends of the slit 112, and the other two of the four connection portions 114 may be located at two sides of the slit 112. In addition, a connection line between the other two of the four connection portions 114 may pass through the slit 112. In some embodiments, the first distance W1, the second distance W2, the third distance W3, and the fourth distance W4 defined by the four connection portions 114 corresponding to the same slit 112 may be the same.

A material of the sheet body 100 may include a plastic material, for example. The material of the sheet body 100 may include polyimide (PI), polymethylmethacrylate (PMMA), polycarbonate (PC), polyethersulfone (PES) resin, polyamide (PA), polynorbornene (PNB), polyethyleneterephthalate (PET), polyether ether ketone (PEEK) resin, polyethylene naphthalate (PEN), polyetherimide (PEI), or a combination thereof. The sheet body 100 is flexible, and is cable of being bent or curved.

Figure 2A:
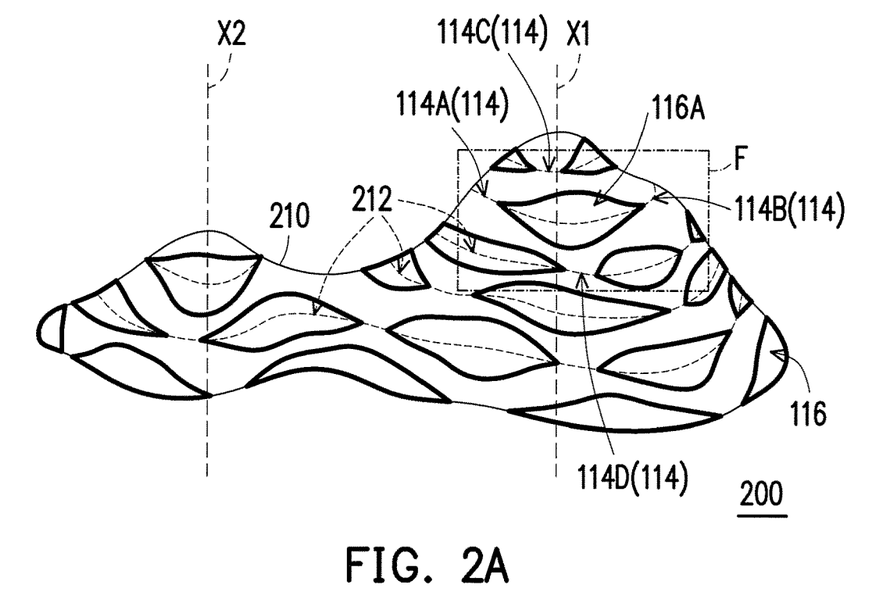
FIG. 2A is a schematic view illustrating that the sheet body of FIG. 1A is extended to form the structure constructed by a sheet.

The sheet body 100 is flexible, and the slits 112 are disposed on the sheet body 100. Thus, the sheet body 100 may be extended in a state as shown in FIG. 2A. In this embodiment, after being extended in the state shown in FIG. 2A, the sheet body 100 may return to the state shown in FIG. 1A after a force of extension disappears. In other words, the sheet body 100 may be alternately extended as shown in the state of FIG. 2A or flattened as shown in the state of FIG. 1A. In other embodiments, the sheet body 100 may remain in the state shown in FIG. 2A without returning to the original state after being extended as in the state of FIG. 2A. In other words, the sheet body 100 may be permanently set in the extended state after being extended. Whether or not the sheet body 100 may return to its original state after being extended is determined by the material and purpose of application of the sheet body 100.

In the extended state, the slits 112 of FIG. 1A may be pulled open to form a plurality of extended openings 116. In addition, at least one of the extended openings 116 is an asymmetric opening, such that the sheet body 100 is extended to form a structure 200 constructed by a sheet. Alternatively, at least one of the extended openings 116 is a symmetric opening. The structure 200 constructed by a sheet may construct a stereoscopic curved surface 210. Alternatively, the structure 200 constructed by a sheet may be formed in accordance with the stereoscopic curved surface 210. Taking FIGS. 1A and 2A as an example, the stereoscopic curved surface 210 formed by the structure 200 constructed by a sheet may have two peaks, and the two peaks are respectively located on central axes X1 and X2. The central axes X1 and X2 may be two axial lines parallel to each other. And the stereoscopic curved surface 210 may use a plane defined by the central axes X1 and X2 as normal lines to set a plurality of contour lines 212.

In this embodiment, the central axes X1 and X2 may correspond to the centers O1 and O2 of FIG. 1A. The enclosed paths 110 in the sheet body 100 of FIG. 1A may correspond to the contour lines 212 of the stereoscopic curved surface 210, and the connection portions 114 may be respectively located on the contour lines 212 of the stereoscopic curved surface 210. The sheet body 100 is extended as in the state shown in FIG. 2A, the connection portions 114 originally located on the same enclosed path 110 in FIG. 1A may be located on the same contour line 212, and the connection lines of the connection portions 114 may be located on the same plane. In addition, the normal lines of the plane are parallel to the central axes X1 and X2.

Figure 2B:
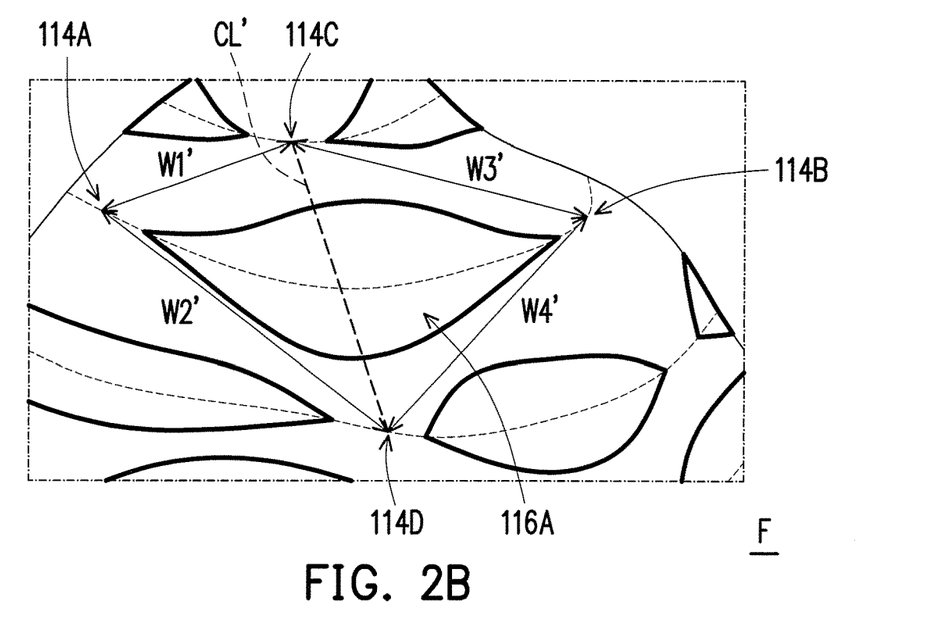
FIG. 2B is a schematic view of a partial region F in FIG. 2A.

In a partial region F as shown in FIG. 2B, the slit 112A corresponding to FIG. 1B is extended to form an extended opening 116A. Under such circumstance, distances between any two of the first connection portion 114A, the second connection portion 114B, the third connection portion 114C and the fourth connection portion 114D corresponding to the extended opening 116A may change. The first distance W1 between the first connection portion 114A and the third connection portion 114C in FIG. 1B becomes a first distance W1' in FIG. 2B after the extension. The second distance W2 between the first connection portion 114A and the fourth connection portion 114D in FIG. 1B becomes a second distance W2' in FIG. 2B after the extension. The third distance W3 between the second connection portion 114B and the third connection portion 114C in FIG. 1B becomes a third distance W3' in FIG. 2B after the extension. The fourth distance W4 between the second connection portion 114B and the fourth connection portion 114D in FIG. 1B becomes a fourth distance W4' in FIG. 2B after the extension.

A first variation ratio S1 of a variation ΔW1 between the first distance W1' and the first distance W1 to the first distance W1 is S1=ΔW1/W1. A second variation ratio S2 of a variation ΔW2 between the second distance W2' and the second distance W2 to the second distance W2 is S2=ΔW2/W2. A third variation ratio S3 of a variation ΔW3 between the third distance W2' and the third distance W3 to the third distance W3 is S3=ΔW3/W3. A fourth variation ratio S4 of a variation ΔW4 between the fourth distance W4' and the fourth distance W4 to the fourth distance W4 is S1=S4=ΔW4/W4. In an embodiment, the first variation ratio S1, the second variation ratio S2, the third variation ratio S3, and the fourth variation ratio S4 are, for example, the same and smaller than a degree of tensile deformation permitted by the sheet body 100. Under such circumstance, forces undertaken by the first connection portion 114A, the second connection portion 114B, the third connection portion 114C, and the fourth connection portion 114D in the extended state may be substantially the same. The structure 200 constructed by a sheet may not be twisted, deformed, or broken due to uneven forces undertaken by the connection portions 114. In other words, in the extended state of this embodiment, the forces undertaken by the connection portions 114 in the structure 200 constructed by a sheet may be substantially the same or similar.

A length of a connection line CL' between the third connection portion 114C and the fourth connection portion 114D is greater than a length of the connection line CL between the third connection portion 114C and the fourth connection portion 114D in FIG. 1B. A difference in length between the connection line CL' and the connection line CL may be proportional to a slope of the stereoscopic curved surface 210. When the difference in length between the connection line CL' and the connection line CL is greater, the slope of the corresponding position is smaller and inclination is more gentle. The slit 112A may be disposed to be longer, such that the variation ratios may be closer. Namely, in the stereoscopic curved surface 210, the distance between the connection portions 114 in a region corresponding to steeper inclination may be shorter, while the distance between the connection portions 114 in a region corresponding to more gentle inclination may be longer. With such design, the forces undertaken by different connection portions 114 tend to be more uniform, so the structure 200 constructed by a sheet has a good quality and is not damaged easily due to a more concentrated/significant force in some of the regions. In other words, when the stereoscopic structure 200 exhibits an asymmetric design, a density of the connection portions 114 may be adjusted in accordance with a change in inclination of the stereoscopic curved surface 210, so as to more evenly distribute the forces.

By planning on a layout of the slits 112 and the connection portions 114, the structure 200 constructed by a sheet may form the stereoscopic curved surface 210 of various kinds. The structure 200 constructed by a sheet formed after the sheet body 100 is extended may be disposed on a stereoscopic object with a predetermined shape, so as to increase an elasticity of in the application of the sheet body 100. For example, the sheet body 100 may serve as a mounting unit mounting an electronic element in an electronic device. With the arrangement of the slits 112 and the connection portions 114, the sheet body 100 may have a stereoscopic design based on a predetermined environment and condition. For example, when the electronic device is a display device, the display device may conformally cover a predetermined stereoscopic object by making use of the design of the embodiment, so as to provide a display effect on the stereoscopic curved surface 210. In another embodiment, the electronic device may be a sensing device and provide a stereoscopic sensing surface.

Figure 3:
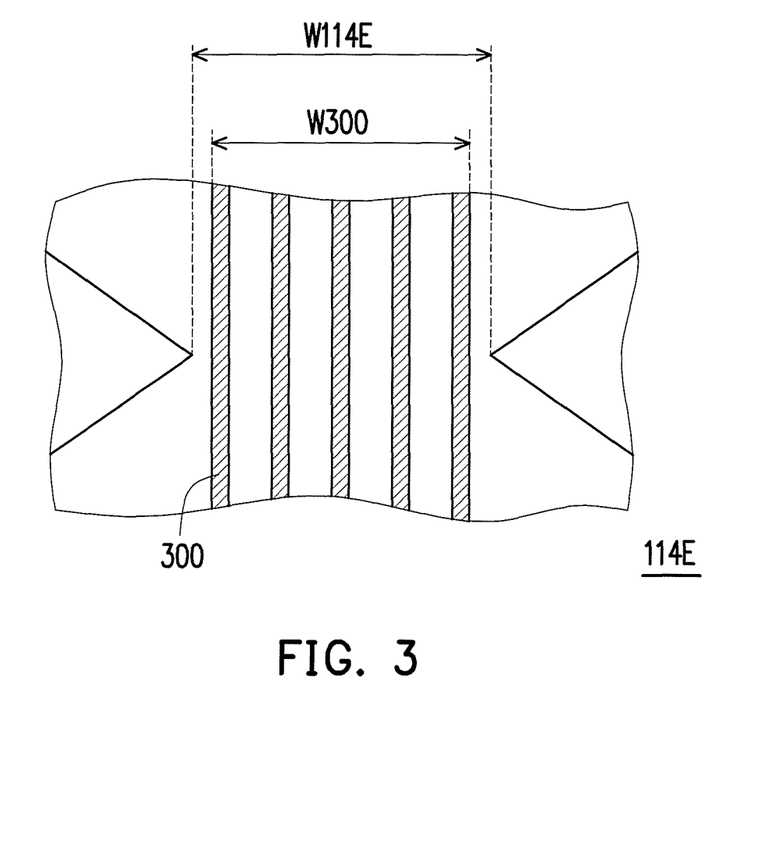
FIG. 3 is a schematic view illustrating a sheet body where wirings are disposed according to an embodiment of the disclosure.

In an embodiment, to enable electrical transmission of the electronic device, at least one wiring 300 may be optionally disposed on the sheet body 100, as shown in FIG. 3. In addition, the wiring 300 may pass through the corresponding connection portion 114E. When the number of the wiring 300 is plural, a width W300 of the wirings 300 (i.e., a distance between two outer sides of the two outermost wirings 300) may be smaller than a width W114E of the corresponding connection portion 114E. In addition, in the extended state, the tensile deformation permitted by the sheet body 100 may be smaller than the wiring 300, so the wiring 300 may not be broken or damaged due to the force of extension. When the sheet body 100 of FIG. 1A is used in the electronic device, it is not mandatory to provide the wiring 300 in each of the connection portions 114. Namely, the wirings 300 may be provided in at least one of the connection portions 114, e.g. a wiring path of the wiring passes through at least one of the connection portions. Moreover, even though the wiring 300 is used as an example to describe a configuration where the sheet body 100 is used in the electronic device in this embodiment, the disclosure is not limited thereto. In other embodiments, a sensing element, a display element, or other active or passive elements configured to carry out a function of the electronic device may be disposed in a region near some of the connection portions 114 or the centers O1 and O2.

Figure 4A:
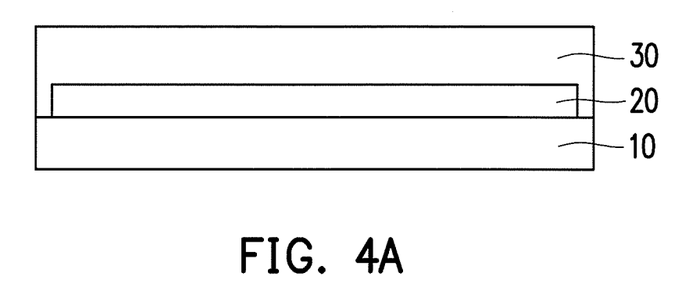
FIGS. 4A to 4G are schematic views illustrating a manufacturing method of a sheet body of a structure constructed by a sheet according to an embodiment of the disclosure.

FIGS. 4A to 4G are schematic views illustrating a manufacturing method of a sheet body of a structure constructed by a sheet according to an embodiment of the disclosure. As shown in FIG. 4A, a mounting board 10 is provided. A release layer 20 and a sheet-like material layer 30 may be sequentially formed on the mounting board 10. The mounting board 10 may be a glass substrate, a metal substrate, a plastic substrate, or other plate-like objects capable of offering a supporting force. The release layer 20 may be adjusted based on a material of the sheet-like material layer 30. The release layer 20 is disposed to reduce adhesion between the sheet-like material layer 30 and the mounting board 10, so as to carry out a subsequent process of removing the mounting board 10 conveniently. An area of the release layer 20 may be optionally smaller than or equal to the sheet-like material layer 30. The material of the sheet-like material layer 30 may include polyimide (PI), polymethylmethacrylate (PMMA), polycarbonate (PC), polyethersulfone (PES) resin, polyamide (PA), polynorbornene (PNB), polyethyleneterephthalate (PET), polyether ether ketone (PEEK) resin, polyethylene naphthalate (PEN), polyetherimide (PEI), or a combination thereof, for example. A formation process of the sheet-like material layer 30 may include coating a layer of the sheet-like material on the mounting board 10 and curing the layer of the sheet-like material to form the sheet-like material layer 30.

Figure 4B:
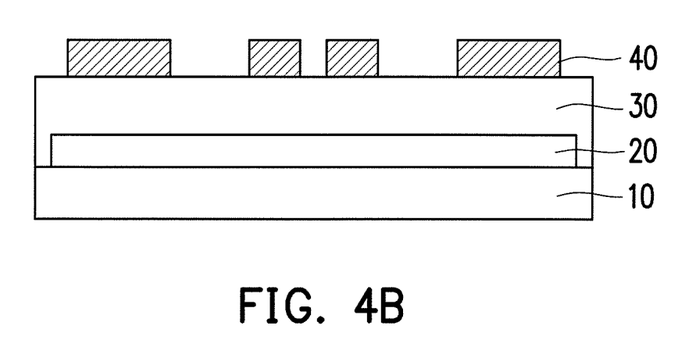

A step of FIG. 4B may be carried out based on the actual application and design requirement. Referring to FIG. 4B, a wiring 40 for an electronic element, for example, may be manufactured on the sheet-like material layer 30. A process of manufacturing the wiring 40 may include, for example, a thin film formation process with a photolithography process, a printing process, or an inkjet process, etc. In this embodiment, in the process of manufacturing the wiring 40, the sheet-like material layer 30 is mounted on the mounting board 10, and the process of manufacturing the wiring 40 may include any process suitable for manufacturing a wiring on a planar substrate.

Figure 4C:
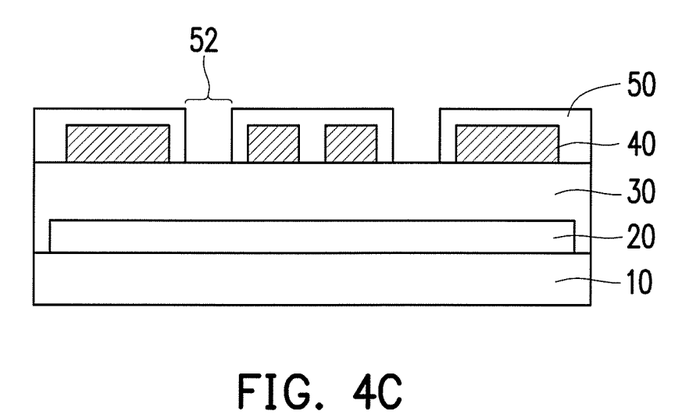

A step in FIG. 4C is performed to form a barrier pattern layer 50. The barrier pattern layer 50 is provided with an opening 52 to expose part of an upper surface of the sheet-like material layer 30. In an embodiment where the wiring 40 is formed, the barrier pattern layer 50 may completely cover the wiring 40. A profile and a position of the opening 52 may be designed in correspondence with the sheet body 100 to be formed. For example, when the sheet body 100 of FIG. 1A is to be formed, the opening 52 may be disposed in correspondence with a position and/or a profile of the slit 112.

Figure 4D:
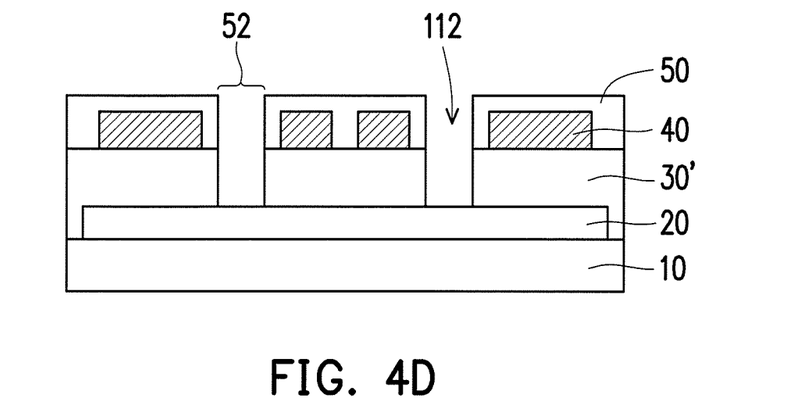

As shown in FIG. 4D, the part of the sheet-like material layer 30 exposed by the opening 52 may be removed by using the barrier pattern layer 50 as a mask, so as to form a sheet-like material layer 30' having the slit 112. In this embodiment, the part of the sheet-like material layer 30 exposed by the opening 52 may be removed by etching, carving, or imprinting. In other embodiments, the barrier pattern layer 50 may not be disposed on the sheet-like material layer 30, and the slit 112 may be formed by laser cutting.

Figure 4E:
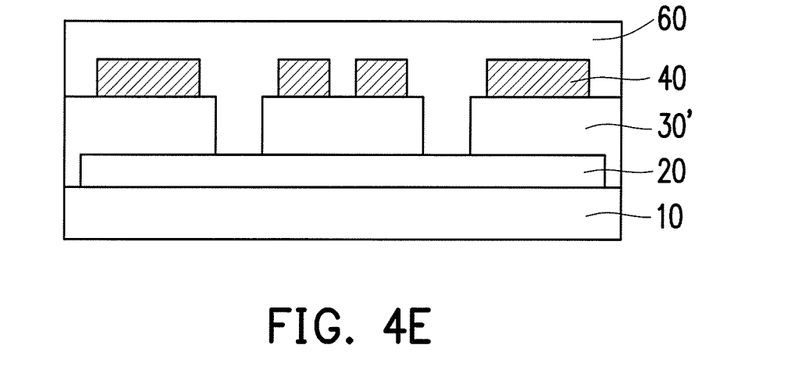

In FIG. 4E, a filling material layer 60 may be selectively formed on the sheet-like material layer 30' after the barrier pattern layer 50 is removed. The filling material layer 60 may be filled into the slit 112. In addition, a material of the filling material layer 60 may include polyurethane (PU), polysiloxane, acrylic resin, ether-containing material, polyolefin material, or a combination thereof, and polysiloxane may include polydimethylsioxane (PDMS). Moreover, tensile deformation permitted by the filling material layer 60 may be greater than that permitted by the sheet-like material layer 30'. In other embodiments, the barrier pattern layer 50 may not be removed, and the filling material layer 60 may be formed when the barrier material layer 50 is present.

Figure 4F:
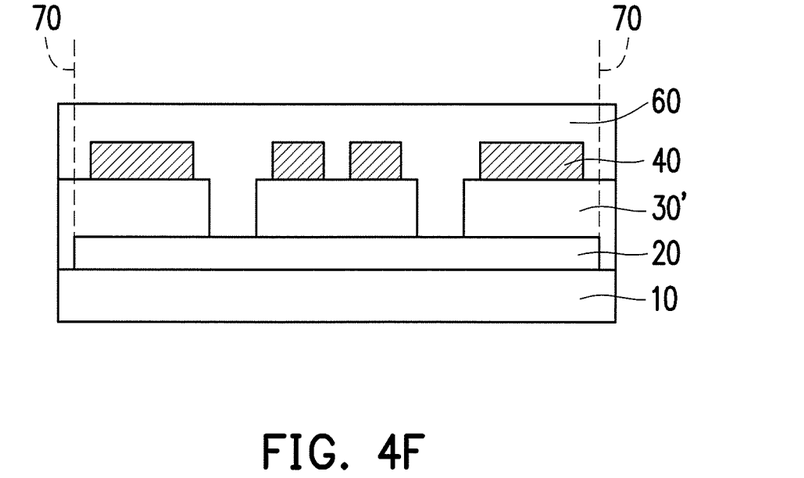
Figure 4G:
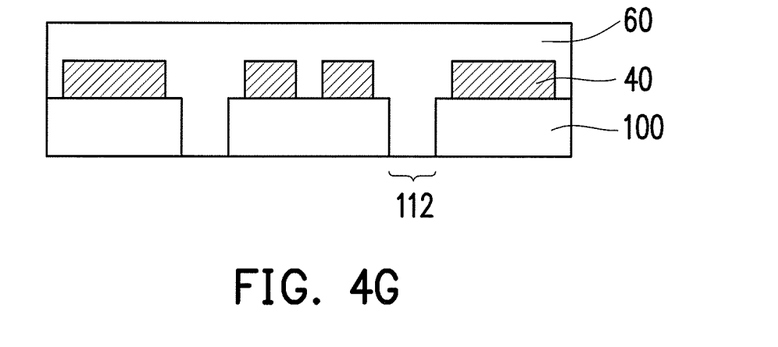

As shown in FIG. 4F, a cutting process may be performed along a cutting line 70 to remove a part of the sheet-like material layer 30' contacting the mounting board 10. The release layer 20 may be exposed at sides. Afterwards, the sheet-like material layer 30' after cutting is peeled off from the mounting board 10. In this way, the sheet body 100 shown in FIG. 4G is obtained. In the sheet body 100, the wiring 40 and the filling material layer 60 are disposed. In this embodiment, the filling material layer 60 further covers an upper surface of the sheet body 100 and the wiring 40 in addition to being filled into the slit 112. However, in other embodiments, the filling material layer 60 may be filled into the slit 112 without covering the upper surface of the sheet body 100.

The tensile deformation permitted by the filling material layer 60 may be greater than that permitted by the sheet body 100. When the sheet body 100 of FIG. 4G is extended and becomes the stereoscopic structure 200 shown in FIG. 2A, the slits 112 are pulled open to form the extended openings 116, and the filling material layer 60 is filled into the extended openings 116. Thus, the opening of the stereoscopic structure 200 may not be hollow. In addition, the filling material layer 60 may help disperse the forces of extension to prevent the sheet body 100 and the wiring 40 thereupon from being damaged easily.

Figure 5:
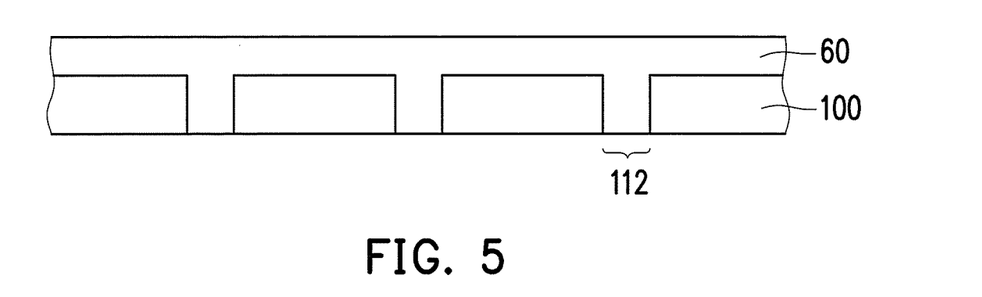
FIG. 5 is a schematic cross-sectional view illustrating a sheet body according to another embodiment.
Figure 6A:
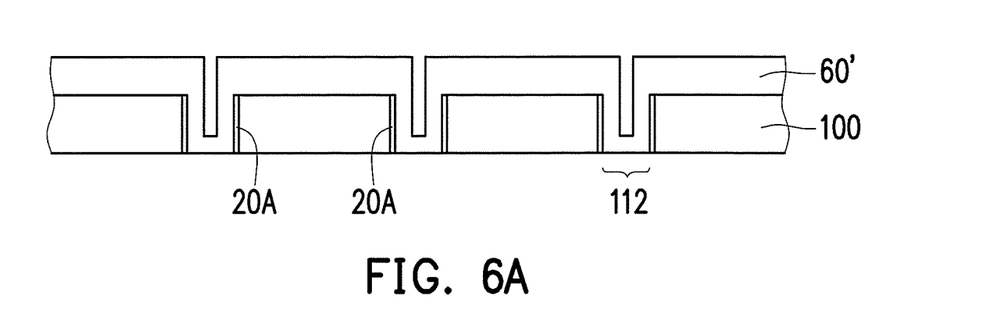
FIG. 6A is a schematic cross-sectional view illustrating a sheet body according to yet another embodiment.
Figure 6B:
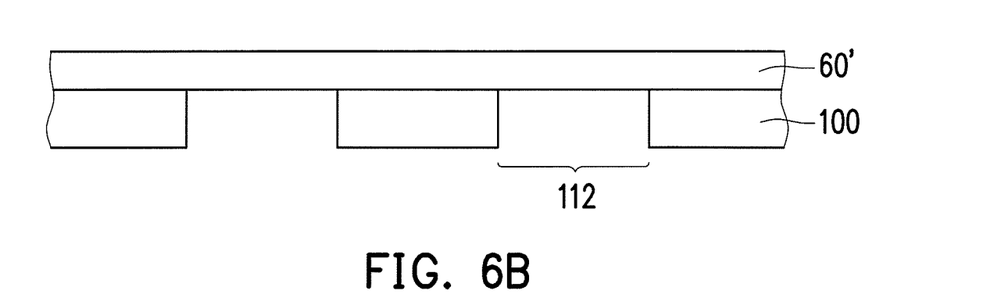
FIG. 6B is a schematic view illustrating that the sheet body of FIG. 6A is extended.

In other embodiments, the step of FIG. 4B may be omitted to manufacture the sheet body 100 without a wiring. A cross-sectional view of the sheet body 100 is as shown in FIG. 5. A side of the sheet body 100 having the slits 112 is covered by the filling material layer 60, and the filling material layer 60 is filled into the slits 112. FIG. 6A is a schematic cross-sectional view illustrating a sheet body according to yet another embodiment, and FIG. 6B is a schematic view illustrating the sheet body of FIG. 6A when the sheet body is extended. In FIG. 6A, the slits 112 of the sheet body 100 may be filled with a filling material layer 60', and the slits 112 may be not fully filled with the filling material layer 60'. A release material layer 20A capable of reducing an adhesive force between sidewalls of the slits 112 of the sheet body 100 and the filling material layer 60' may be selectively coated on the sidewalls of the slits 112. In FIG. 6B, the slits 112 of the sheet body 100 are extended to form the extended openings 116. Moreover, the filling material layer 60' is pulled open and the filling material layer 60' that is pulled open may serve to support the extended openings 116. The filling material layer 60' and the filling material layer 60 may have the characteristic of deforming restorably or permanently. When the filling material layer 60' and the filling material layer 60 has the characteristic of deforming restorably, the sheet body is manufactured with a restorable material, the structure constructed by a sheet may alternately change between the extended state and the flattened state. When the filling material layer 60' and the filling material layer 60 have the characteristic of deforming permanently, the structure constructed by a sheet is unable to return to the flattened state after being extended.

Figure 7:
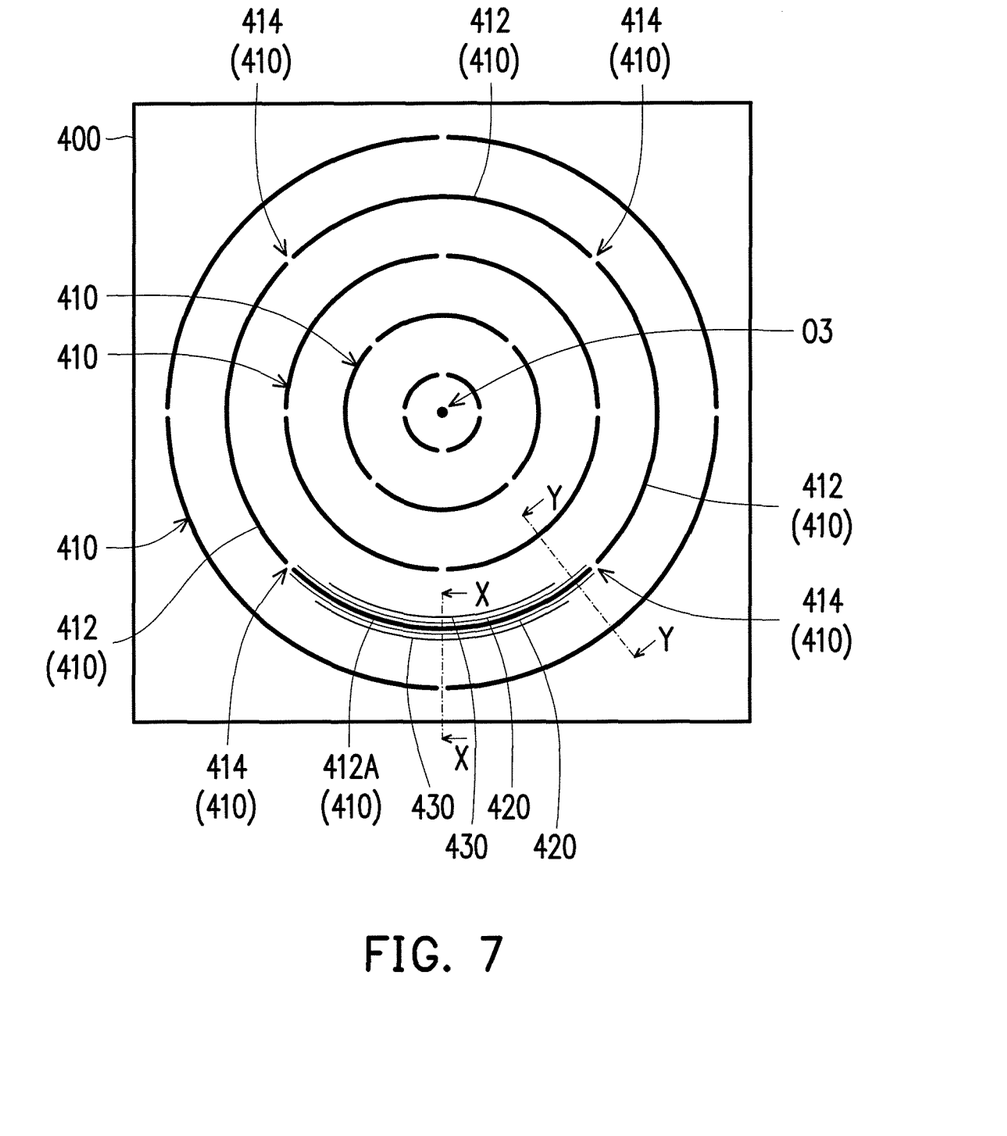
FIG. 7 is a schematic view illustrating a sheet body of a structure constructed by a sheet according to another embodiment of the disclosure in an extended state.

FIG. 7 is a schematic view illustrating a sheet body of a structure constructed by a sheet according to another embodiment of the disclosure in an extended state. Referring to FIG. 7, a sheet body 400 has a plurality of enclosed paths 410. In addition, a plurality of slits 412 and a plurality of connection portions 414 may be disposed along each of the enclosed paths 410. Each connection portion 414 is located between two slits 412. In this embodiment, the number of the enclosed paths 410 is five, for example, and the enclosed paths 410 are sequentially arranged from inner to outer and surrounding the same center O3. In addition, the enclosed paths 410 do not overlap or intersect each other. A density and profiles of the enclosed paths 410 and the numbers of the slits 412 and the connection portions 414 disposed on each enclosed path 410 may be adjusted based on different needs. FIG. 7 serves to describe an arrangement of the enclosed paths 410 and the corresponding slits 412 and connection portions 414 for an illustrative purpose, and shall not be construed as a limitation on how the embodiment should be implemented.

Here, a slit 412A is used as an example to describe a design of the sheet body 400 of this embodiment. A structural design of the slit 412A described in this embodiment is applicable to the slits 412 in the sheet body 400 as well as the slits 112 of the sheet body 100 of FIG. 1A. In correspondence with the slit 412A, at least one first sub-slit 420 and/or at least one second sub-slit 430 may be disposed in the sheet body 400. An extending trajectory of the first sub-slit 420 may be in accordance with the slit 412A, and the slit 412A is located between two first sub-slits 420. The first sub-slits 420 and the slit 412A may be disposed between two second sub-slits 430. In addition, extending trajectories of the second sub-slits 430 may also be in accordance with the slit 412A. Namely, the first sub-slit 420 is located between one of the second sub-slits 430 and the slit 412A, and the first sub-slits 420, the second sub-slits 430, and the slit 412A do not intersect each other. In addition, lengths of the first sub-slits 420 may be respectively smaller than that of the slit 412A, and lengths of the second sub-slits 430 may be respectively smaller than the lengths of the first sub-slits 420. As shown in FIG. 7, the lengths of the second sub-slits corresponding to the slit 412A gradually decrease going outward.

Figure 8A:
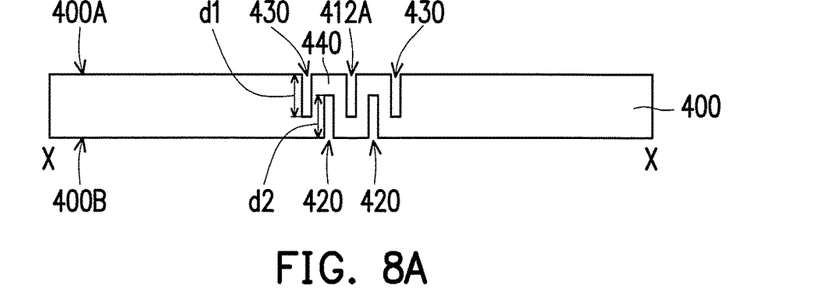
FIG. 8A is a schematic cross-sectional view illustrating the sheet body of FIG. 7 along a line X-X when the sheet body is not extended.
Figure 8B:
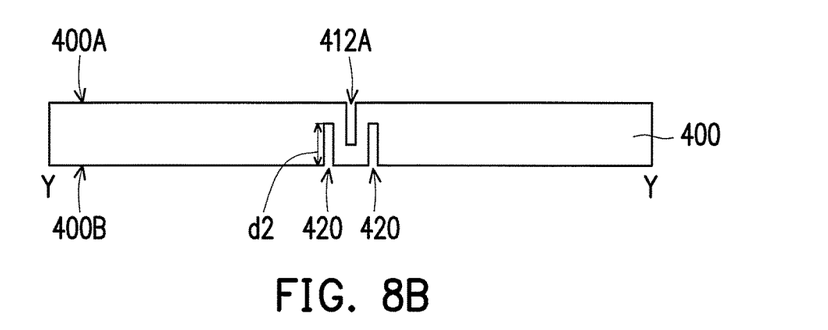
FIG. 8B is a schematic cross-sectional view illustrating the sheet body of FIG. 7 along a line Y-Y when the sheet body is not extended.

FIG. 8A is a schematic cross-sectional view illustrating the sheet body of FIG. 7 along a line X-X when the sheet body is not extended, and FIG. 8B is a schematic cross-sectional view illustrating the sheet body of FIG. 7 along a line Y-Y when the sheet body is not extended. Referring to FIGS. 8A and 8B, the slit 412A and the second sub-slits 430 may respectively extend inwardly for a first depth d1 from a first surface 400A of the sheet body 400, and the first sub-slits may respectively extend inwardly for a second depth d2 from a second surface 400B of the sheet body 400. The first surface 400A and the second surface 400B are opposite to each other, and the first depth d1 and the second depth d2 are smaller than a thickness t of the sheet body 400. In this embodiment, the first depth d1 and the second depth d2 may be greater than a half of the thickness t of the sheet body 400. In addition, the first depth d1 and the second depth d2 may not be the same. Namely, none of the slit 412A, the first sub-slits 420, and the second sub-slits 430 penetrates through the sheet body 400. Accordingly, the sheet body 400 may include a thinner portion 440. Moreover, when the sheet body 400 is not extended, the thinner portion 440 is in accordance with the slit 412A, the first sub-slits 420, and/or the second sub-slits 430 and is in a corrugated shape.

Figure 9A:
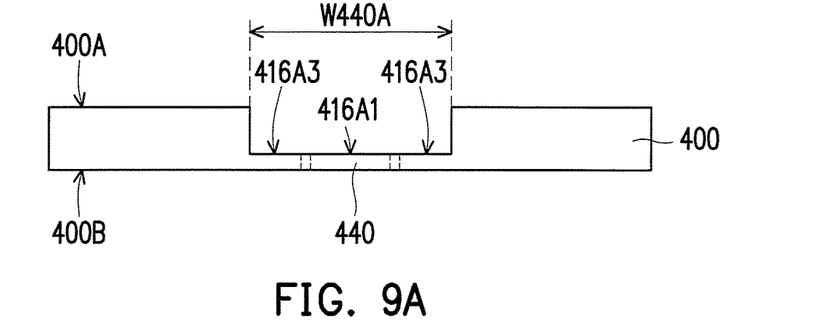
FIG. 9A is a schematic cross-sectional view illustrating the sheet body of FIG. 7 along the line X-X when the sheet body is extended.
Figure 9B:
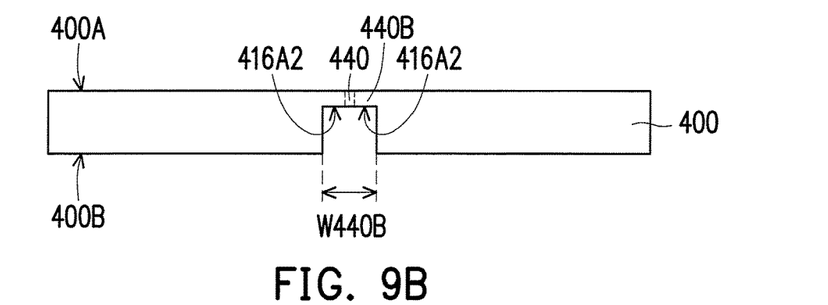
FIG. 9B is a schematic cross-sectional view illustrating the sheet body of FIG. 7 along the line Y-Y when the sheet body is extended.

FIG. 9A is a schematic cross-sectional view illustrating the sheet body of FIG. 7 along the line X-X when the sheet body is extended, and FIG. 9B is a schematic cross-sectional view illustrating the sheet body of FIG. 7 along the line Y-Y when the sheet body is extended. After the sheet body 400 is extended, the slit 412A, the first sub-slits 420, and the second sub-slits 430 of FIG. 7 may respectively form an extended opening 461A1, extended openings 416A2, and extended openings 416A3. As shown in FIGS. 8A and 8B, none of the slit 412A, the first sub-slits 420, and the second sub-slits 430 penetrates through the sheet body 400. In addition, the extended opening 416A1, the extended openings 416A2, and the extended openings 416A3 are formed by extending the slit 412A, the first sub-slits 420, and the second sub-slits 430. In FIGS. 9A and 9B, the thinner portion 400 of the sheet body 400 may be changed from the original bent state to a flatter state. Accordingly, the sheet body 400 remains to be a continuous structure constructed by a sheet after being extended. The sheet body 400 may completely cover a surface of a stereoscopic object without a hollow hole. With the design of the lengths of the sub-slits, the thinner portion 440 has a width W440A at a position corresponding to the line X-X, as shown in FIG. 9A. The thinner portion 440 has a width W440B at a position corresponding to the line Y-Y, as shown in FIG. 9B. The width W440A of the thinner portion 440 may be greater than the width W440B of the thinner portion 440. In this way, the position corresponding to the line X-X in FIG. 7 may be extended to a greater extent, and the position corresponding to the line Y-Y in FIG. 7 may be extended to a lesser extent. Thus, the lengths of the sub-slits may be adjusted in accordance with different requirements on extension. In addition, the number of sub-slits may be adjusted based on different design requirements. In another embodiment, other slits may be disposed at sides of the second sub-slits 430 away from the slit 412A, or the second sub-slits 430 may be omitted.

The structure constructed by a sheet according to an embodiment of the disclosure may be extended from the original sheet body in a planar state to a stereoscopic state by disposing the slits and the connection portions between the slits on the sheet body. In addition, the slits on the sheet body are designed in accordance with the stereoscopic state after extension. After the slits are extended to form the openings, the connection portions between the slits are able to undertake forces without being twisted and deformed or even broken and damaged. By disposing an electronic element on the sheet body, an electronic device having a stereoscopic curved surface design is formed.

It will be clear that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A structure constructed by a sheet, comprising:
a sheet body, having a plurality of enclosed paths, wherein a plurality of slits and a plurality of connection portions are disposed along each of the enclosed paths, and each of the connection portions is located between two adjacent slits, and
wherein the sheet body is flexible, the slits form a plurality of extended openings in an extended state, and at least one of the extended openings is a symmetric opening, such that the sheet body is extended to foul' the structure, the structure constructs a stereoscopic curved surface, and the connection portions are arranged along a plurality of contour lines on the stereoscopic curved surface.

2. The structure as claimed in claim 1, wherein widths of the slits or widths of the connection portions on one of the enclosed paths have at least two values, and the widths are obtained by measuring along a corresponding enclosed path.

3. The structure as claimed in claim 1, wherein at least a portion of the enclosed paths surrounds a same center.

4. The structure as claimed in claim 1, wherein a material of the sheet body comprises a plastic material.

5. The structure as claimed in claim 1, further comprising a plurality of wirings disposed on the sheet body, wherein a wiring path of the wiring passes through at least one of the connection portions.

6. The structure as claimed in claim 5, wherein tensile deformation permitted by the sheet body is smaller than tensile deformation permitted by the wirings.

7. The structure as claimed in claim 1, further comprising a filling material layer filled in the slits, wherein tensile deformation permitted by the filling material layer is greater than tensile deformation permitted by the sheet body, and the filling material layer is filled into the extended openings formed by pulling open the slits.

8. The structure as claimed in claim 7, wherein a material of the filling material layer comprises polyurethane (PU), polysiloxane, acrylic resin, ether-containing material, polyolefin material, or a combination thereof.

9. The structure as claimed in claim 1, wherein the slits do not return to an original state after being pulled open to form the extended openings.

10. The structure as claimed in claim 1, wherein a first connection portion, a second connection portion, a third connection portion and a fourth connection portion surround one of the slits on one of the enclosed paths, the first connection portion and the second connection portion are at two ends of the one of the slits, the third connection portion is on a previous enclosed path of the enclosed paths, the fourth connection portion is on a next enclosed path of the enclosed paths, and a connection line connecting the third connection portion and the fourth connection portion intersects the one of the slits.

11. The structure as claimed in claim 10, wherein a first distance is provided between the first connection portion and the third connection portion, a second distance is provided between the first connection portion and the fourth connection portion, a third distance is provided between the second connection portion and the third connection portion, a fourth distance is provided between the second connection portion and the fourth connection portion, and the first distance, the second distance, the third distance, and the fourth distance are different.

12. The structure as claimed in claim 11, wherein
the first distance changes before and after the one of the slits is extended to form the extended opening to generate a variation of the first distance, a first variation ratio is a ratio of the variation of the first distance to a value of the first distance before the extension,
the second distance changes before and after the one of the slits is extended to form the extended opening to generate a variation of the second distance, a second variation ratio is a ratio of the variation of the second distance to a value of the second distance before the extension,
the third distance changes before and after the one of the slits is extended to form the extended opening to generate a variation of the third distance, a third variation ratio is a ratio of the variation of the third distance to a value of the third distance before the extension,
the fourth distance changes before and after the one of the slits is extended to form the extended opening to generate a variation of the fourth distance, a fourth variation ratio is a ratio of the variation of the fourth distance to a value of the fourth distance before the extension, and
the first variation ratio, the second variation ratio, the third variation ratio, and the fourth variation ratio are substantially the same.

13. The structure as claimed in claim 10, wherein the smaller a length variation of the connection line before and after the extension, the greater a length of the one of the slit.

14. The structure as claimed in claim 1, further comprises a plurality of first sub-slits are disposed on the sheet body, extending trajectories of the first sub-slits are in accordance with one of the slits, and the one of the slits is located between the first sub-slits.

15. The structure as claimed in claim 14, wherein lengths of the first sub-slits are respectively smaller than a length of the one of the slits.

16. The structure as claimed in claim 14, wherein the one of the slits extends inwardly for a first depth from a first surface of the sheet body, the first sub-slits respectively extend inwardly for a second depth from a second surface of the sheet body, the first surface and the second surface are opposite to each other, and the first depth and the second depth are smaller than a thickness of the sheet body but greater than a half of the thickness of the sheet body.

17. The structure as claimed in claim 14, further comprises a plurality of second sub-slits are disposed on the sheet body, the first sub-slits and the one of the slits are located between the second sub-slits, extending trajectories of the second sub-slits are respectively in accordance with the one of the slits, and lengths of the second sub-slits are smaller than lengths of the first sub-slits.

18. The structure as claimed in claim 17, wherein the one of the slits and the second sub-slits respectively extend inwardly for a first depth from a first surface of the sheet body, the first sub-slits respectively extend inwardly for a second depth from a second surface of the sheet body, the first surface and the second surface are opposite to each other, and the first depth and the second depth are smaller than a thickness of the sheet body but greater than a half of the thickness of the sheet body.

19. The structure as claimed in claim 18, wherein, in the extended state, the one of the slits, the first sub-slits, and the second sub-slits respectively form one of the extended openings.

20. The structure as claimed in claim 19, wherein the sheet body further comprises a thinner portion, and when the sheet body is not extended, the thinner portion is in accordance with the one of the slits, the first sub-slits, and/or the second sub-slits and in a corrugated shape.

* * * * *